(12) United States Patent
Outram

(10) Patent No.: US 10,779,448 B2
(45) Date of Patent: Sep. 15, 2020

(54) CORONA SHIELDS

(71) Applicant: General Electric Technology GmbH, Baden (CH)

(72) Inventor: John Lewis Outram, Stone (GB)

(73) Assignee: General Electric Technology GmbH, Baden (CH)

( * ) Notice: Subject to any disclaimer, the term of this patent is extended or adjusted under 35 U.S.C. 154(b) by 0 days.

(21) Appl. No.: 16/064,407

(22) PCT Filed: Dec. 20, 2016

(86) PCT No.: PCT/EP2016/081997
§ 371 (c)(1),
(2) Date: Jun. 20, 2018

(87) PCT Pub. No.: WO2017/108839
PCT Pub. Date: Jun. 29, 2017

(65) Prior Publication Data
US 2019/0014694 A1    Jan. 10, 2019

(30) Foreign Application Priority Data
Dec. 22, 2015  (GB) .................................. 1522591.5

(51) Int. Cl.
*H02M 5/458*        (2006.01)
*H05K 9/00*         (2006.01)
*H01T 19/02*        (2006.01)
*H05K 5/02*         (2006.01)

(52) U.S. Cl.
CPC .......... *H05K 9/0007* (2013.01); *H01T 19/02* (2013.01); *H05K 5/0217* (2013.01)

(58) Field of Classification Search
CPC ....................................................... H05K 7/00
See application file for complete search history.

(56) References Cited

U.S. PATENT DOCUMENTS

2013/0278194 A1* 10/2013 Numakura .............. B60L 3/003
                                                          318/400.27
2014/0313797 A1   10/2014 Davidson et al.

FOREIGN PATENT DOCUMENTS

CN      105047361 A    11/2015
WO      2017/108839 A1  6/2017

OTHER PUBLICATIONS

Combined Search and Examination Report issued in connection with corresponding GB Application No. 1522591.5 dated Jun. 22, 2016, 6 pages.
International Search Report and Written Opinion issued in connection with corresponding PCT Application No. PCT/EP2016/081997 dated Feb. 24, 2017, 9 pages.

(Continued)

*Primary Examiner* — Jerry Wu
(74) *Attorney, Agent, or Firm* — Eversheds Sutherland (US) LLP

(57) ABSTRACT

In the field of voltage assemblies with a charge storage capability for use in high voltage direct current converters there is provided a corona shield. The corona shield includes a peripheral frame which is formed from one or more frame members and within which lies a frame aperture. The corona shield also includes a barrier member that is fixedly secured to the peripheral frame. The barrier member extends across and occludes the frame aperture to inhibit bodily ingress through the frame aperture.

4 Claims, 3 Drawing Sheets

(56) References Cited

OTHER PUBLICATIONS

International Preliminary Report on Patentability issued in connection with corresponding PCT Application No. PCT/EP2016/081997 dated Jun. 26, 2018, 6 pages.
Examination Report issued in connection with corresponding GB Application No. 1522591.5 dated Aug. 30, 2018, 4 pages.

* cited by examiner

CORONA SHIELDS

FIELD OF INVENTION

This invention relates to a corona shield for a high voltage assembly with a charge storage capability, a high voltage assembly for a high voltage direct current (HVDC) converter including such a corona shield, and a HVDC converter including such a high voltage assembly.

BACKGROUND

In power transmission networks alternating current (AC) power is typically converted to direct current (DC) power for transmission via overhead lines and/or under-sea cables. This conversion removes the need to compensate for the AC capacitive load effects imposed by the transmission line or cable and reduces the cost per kilometre of the lines and/or cables, and thus becomes cost-effective when power needs to be transmitted over a long distance.

HVDC converters are used to convert between AC power and DC power and such converters are one example of an electrical equipment item that incorporates a number of high voltage assemblies, i.e. electrical assemblies which typically operate at or above about 1.5 kV DC, that are capable of storing a charge.

SUMMARY

According to a first aspect of the invention there is provided a corona shield, for a high voltage assembly with a charge storage capability, including:
 a peripheral frame formed from one or more frame members and within which lies a frame aperture; and
 a barrier member fixedly secured to the peripheral frame, the barrier member extending across and occluding the frame aperture to inhibit bodily ingress through the frame aperture.

The inclusion of a barrier member which extends across and occludes the frame aperture to inhibit bodily ingress, i.e. the ingress of a human body part, through the frame aperture is advantageous because in use it avoids the need to verify the absence of a voltage (which would otherwise expose a maintenance operative to a potentially fatal electric shock) at a high voltage assembly that the corona shield is arranged to protect, and so dramatically speeds up access to a single, e.g. damaged, high voltage assembly requiring maintenance or replacement within a tiered array of many similarly-protected high voltage assemblies.

The barrier member is separately formed from the peripheral frame.

Such an arrangement permits the barrier member to be made from a different material, e.g. one having different material properties, to that of the peripheral frame.

Optionally the barrier member is formed from an electrically insulating material.

Forming the barrier member from such a material desirably allows the barrier member to provide a degree of electrical protection to, e.g. a maintenance operative in the vicinity of the corona shield (and the associated high voltage assembly it is in use arranged to protect) that may inadvertently make bodily contact with the barrier member. In addition an electrically insulating barrier member is less prone to damage from arcing, e.g. in the event that the corona shield is connected to a safety earth for maintenance purposes.

The barrier member may be formed from an electrically conducting material.

The inclusion of a barrier member formed from an electrically conducting material permits the barrier member to supplement the electrostatic performance of the peripheral frame and thereby enhance or tune such electrostatic performance.

The barrier member is electrically bonded to the peripheral frame.

Such electrical bonding helps to ensure that the barrier member reliably and effectively supplements the electrostatic performance of the peripheral frame.

In a preferred embodiment of the invention the barrier member is perforated.

Having a perforated barrier member reduces any impact the inclusion of a barrier member may have on the ventilation provided to the high voltage assembly protected by the corona shield, and it also allows the high voltage assembly to remain visible to at least some extent. In addition, the inclusion of a perforated barrier member helps to keep the overall mass of the corona shield to a minimum.

Optionally the maximum dimension of each perforation within the barrier member is not more than 50 mm.

Limiting the maximum dimension of each perforation to 50 mm permits adequate ventilation while reducing the risk of, e.g. a maintenance operative inadvertently forcing his or her hand through the barrier member and thereby coming within dangerous proximity of the high voltage assembly being protected in use by the corona shield of the invention.

In another preferred embodiment of the invention the minimum dimension of at least one perforation within the barrier member is not less than 25 mm.

The inclusion of at least one perforation which is not smaller than 25 mm helps to ensure no bodily ingress via the or each such perforation, while at the same time in use allowing access by an item of test equipment, such as a voltage tester probe, to the high voltage assembly being protected in order to permit, e.g. the absence of a residual voltage at the high voltage assembly to be verified.

The barrier member may be or include a mesh.

Having a barrier member that is or includes a mesh facilities ready manufacture of the barrier member in a manner that provides a desired degree of ventilation while suitably inhibiting ingress through the frame aperture.

Optionally the barrier member can deform relative to the frame aperture to only a predetermined extent.

Allowing the barrier member to deform relative to the frame aperture to only a predetermined extent helps to ensure that the barrier member does not contact the high voltage assembly it is, in use, protecting whereby it might otherwise expose, e.g. a maintenance operative, to a potentially fatal electric shock.

In a further preferred embodiment of the invention the barrier member cannot deform beyond the frame aperture.

Such an arrangement helps to ensure that the barrier member cannot contact the high voltage assembly irrespective of the spatial relationship between the corona shield and the high voltage assembly it is in use protecting.

According to a second aspect of the invention there is provided a high voltage assembly, for a HVDC converter, having secured thereto a corona shield as described hereinabove.

Such a high voltage assembly shares the advantages associated with the corresponding features of the corona shield of the invention.

Optionally the corona shield is moveable between a closed position in which it provides protection to the high voltage assembly and an open position in which access to the high voltage assembly is possible.

The inclusion of such a moveable corona shield desirably permits access to the associated high voltage assembly when needed, e.g. to repair or replace the said high voltage assembly.

According to a third aspect of the invention there is provided a HVDC converter comprising a plurality of high voltage assemblies as described hereinabove.

The benefit of the corona shield of the invention, in terms of avoiding the need to verify the absence of a voltage at a large number of high voltage assemblies, is particularly manifest in such HVDC converters which typically include one or more tiered arrays of many such high voltage assemblies.

BRIEF DESCRIPTION OF THE DRAWINGS

There now follows a brief description of preferred embodiments of the invention, by way of non-limiting example, with reference being made to the following figures in which.

DETAILED DESCRIPTION

Figure 1:
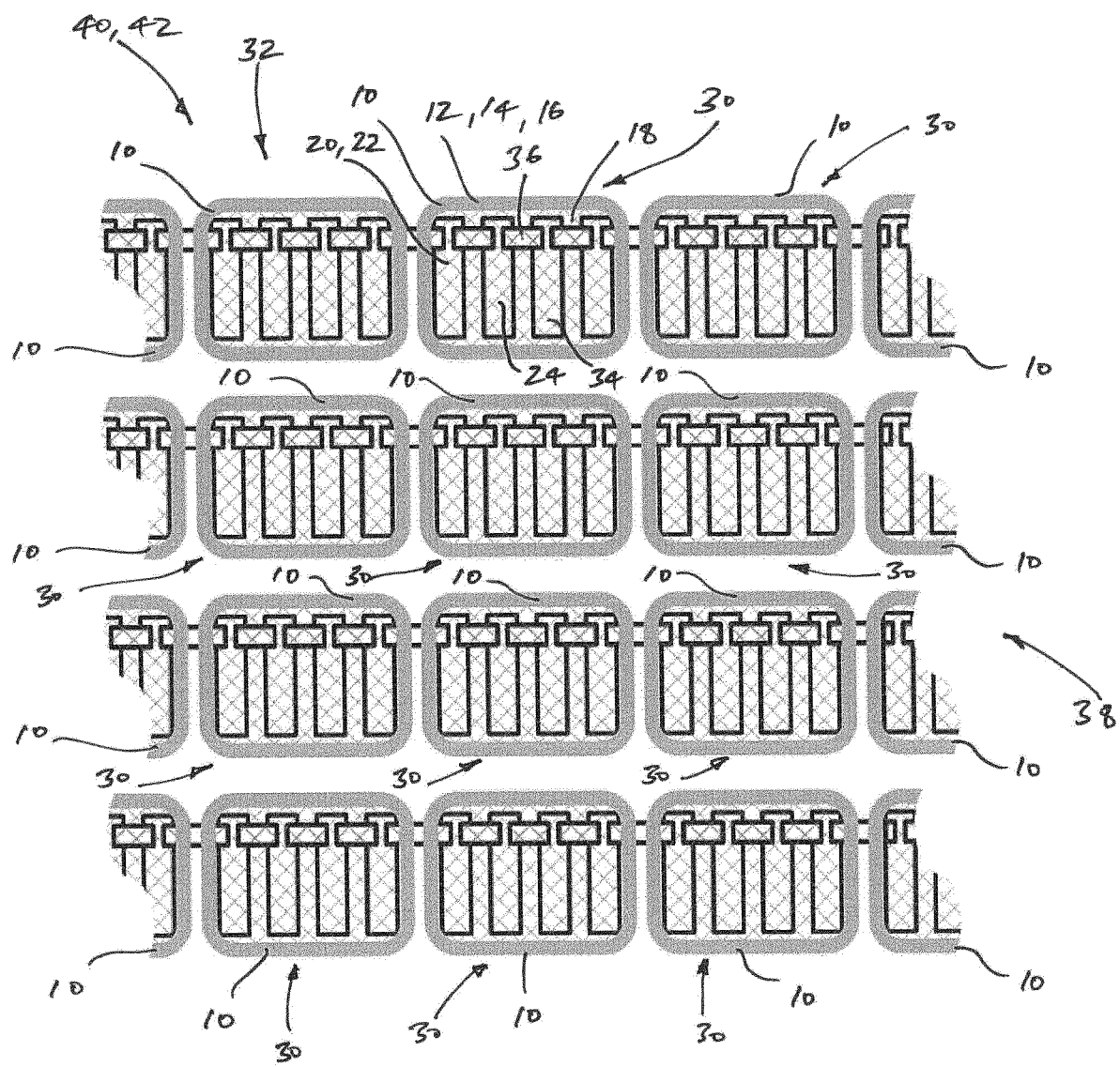
FIG. 1 shows a schematic partial view of a portion of valve within a HVDC converter according to an embodiment of the invention including a tiered array of many high voltage assemblies each of which is protected by a corona shield.

A corona shield according to an embodiment of the invention is designated generally by reference numeral 10, as shown in FIG. 1.

The corona shield 10 includes a peripheral frame 12 which, in the embodiment shown, is rectangular and formed from a single frame member 14. More particularly the single frame member 14 is a tubular aluminium member 16 which is formed, e.g. bent, into a rectangle having rounded corners with the resulting abutting ends (not shown) of the tubular aluminium member 16 then being welded together. In other embodiments of the invention (not shown) the peripheral frame 12 may have a different shape, and may be formed from one or more frame members which may or may not be tubular and may or may not be aluminium.

In all cases, irrespective of how the peripheral frame 12 is fabricated, a frame aperture 18 lies within the peripheral frame 12.

The corona shield 10 also includes a barrier member 20 which is fixedly secured to the peripheral frame 12. The barrier member 20 extends across and occludes the frame aperture 18 to inhibit bodily ingress through the frame aperture 18.

In the embodiment shown the barrier member 20 is separately formed from the peripheral frame 12, and more particularly is formed from a wire mesh 22. In this manner the barrier member 20 is both electrically conducting and perforated. In other embodiments of the invention the barrier member may be formed from an electrically insulating material, may or may not be a mesh, and may indeed be perforated in a different manner.

Meanwhile, as a consequence of the aforementioned electrically conducting nature of the barrier member 20, it is electrically bonded to the peripheral frame 12, i.e. even though it is not designed to carry an electrical current it is intentionally electrically connected to the peripheral frame 12 in order to provide protection from electric shock.

In the meantime the barrier member 20 is perforated to the extent that a maximum dimension of respective perforations 24 within the barrier member 20 is not more than 50 mm. In other embodiments of the invention (not shown) the maximum dimension of respective perforations within the barrier member 20 may be greater than 50 mm providing that the perforations 24 continue to inhibit ingress through the frame aperture 18 of bodily parts such as hands and feet. However, the maximum dimension of the perforations 24 lies within the range of 25 mm to 50 mm.

Figure 2:
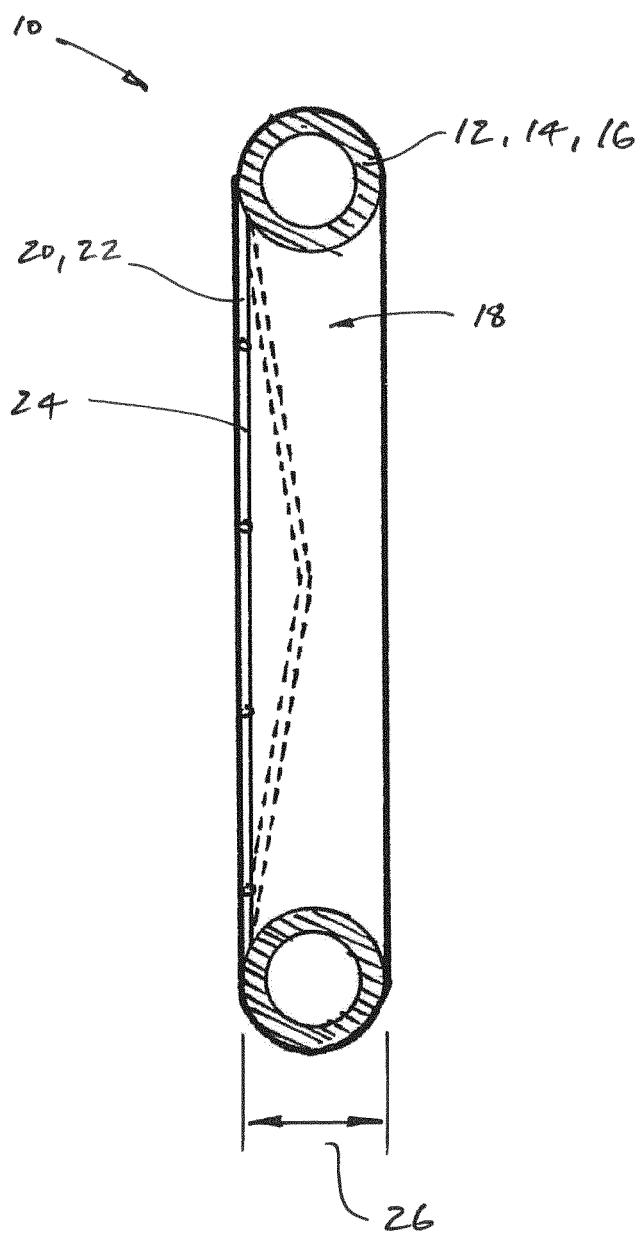
FIG. 2 shows a schematic cross-sectional view through one of the corona shields shown in FIG. 1.

The barrier member 20 shown, e.g. in FIG. 2, is able to deform relative to the frame aperture 18 to only a predetermined extent which, in the embodiment shown, is not beyond the frame aperture 18, i.e. is not more than the depth 26 of the frame aperture 18. More particularly, the extent to which the barrier member 20 is able to deform relative to the frame aperture 18 is is not more than half of the depth 26 of the frame aperture 18. Such limited deformation of the barrier member 20 may be achieved by providing the barrier member 20 with sufficient inherent stiffness or by supporting the barrier member 20 in tension within a stronger peripheral frame 12.

In other embodiments of the invention the barrier member may be sufficiently rigid such that no appreciable deformation occurs, e.g. when impacted by a maintenance operative.

In any event, i.e. irrespective of whether the barrier member 20 is deformable or not, the closest proximity of the barrier member 20 to a high voltage assembly 30 it is protecting is not less than 80 mm.

In use the corona shield 10 is connected to and protects a high voltage assembly 30. In the embodiment shown the high voltage assembly 30 is part of a valve 32 which forms a part of a HVDC converter 40, and more particularly a part of a HVDC voltage source converter 42. To that end the high voltage assembly 30 includes a plurality of chain-link modules 34 (only four of which are shown in the figures for clarity purposes) that are connected in series with one another by respective bus bars 36. Each chain-link module 34 includes a number of switching elements (not shown) that are connected in parallel with an energy storage device in the form of a capacitor. Selective operation of the switching elements in each chain-link module 34 permits the series-connected chain of such modules 34 to provide a stepped variable voltage source.

The corona shield of the invention may, however, be used to protect other high voltage assemblies which do not necessarily form a part of a HVDC voltage source converter.

Returning to the embodiment shown in FIG. 1, the valve 32 of the HVDC voltage source converter 42 includes a large number of essentially identical high voltage assemblies 30 which are arranged in a tiered array 38. Each such high voltage assembly 30 has a corona shield 10 connected thereto to provide protection. In each instance the corona shield 10 is moveable between a closed position (as shown) in which it overlies and protects the associated high voltage assembly 30, and an open position (not shown) in which access to the corresponding high voltage assembly 30 is possible. In the embodiments shown, each corona shield 10 is pivotally connected to the corresponding high voltage assembly 30 so that it can be swung between the said open and closed positions. In other embodiments, however, each corona shield 10 may instead be simply removable from the associated high voltage assembly 30 so that it can be moved to a positon spaced from the said high voltage assembly 30 in order to provide assess thereto.

Figure 3:
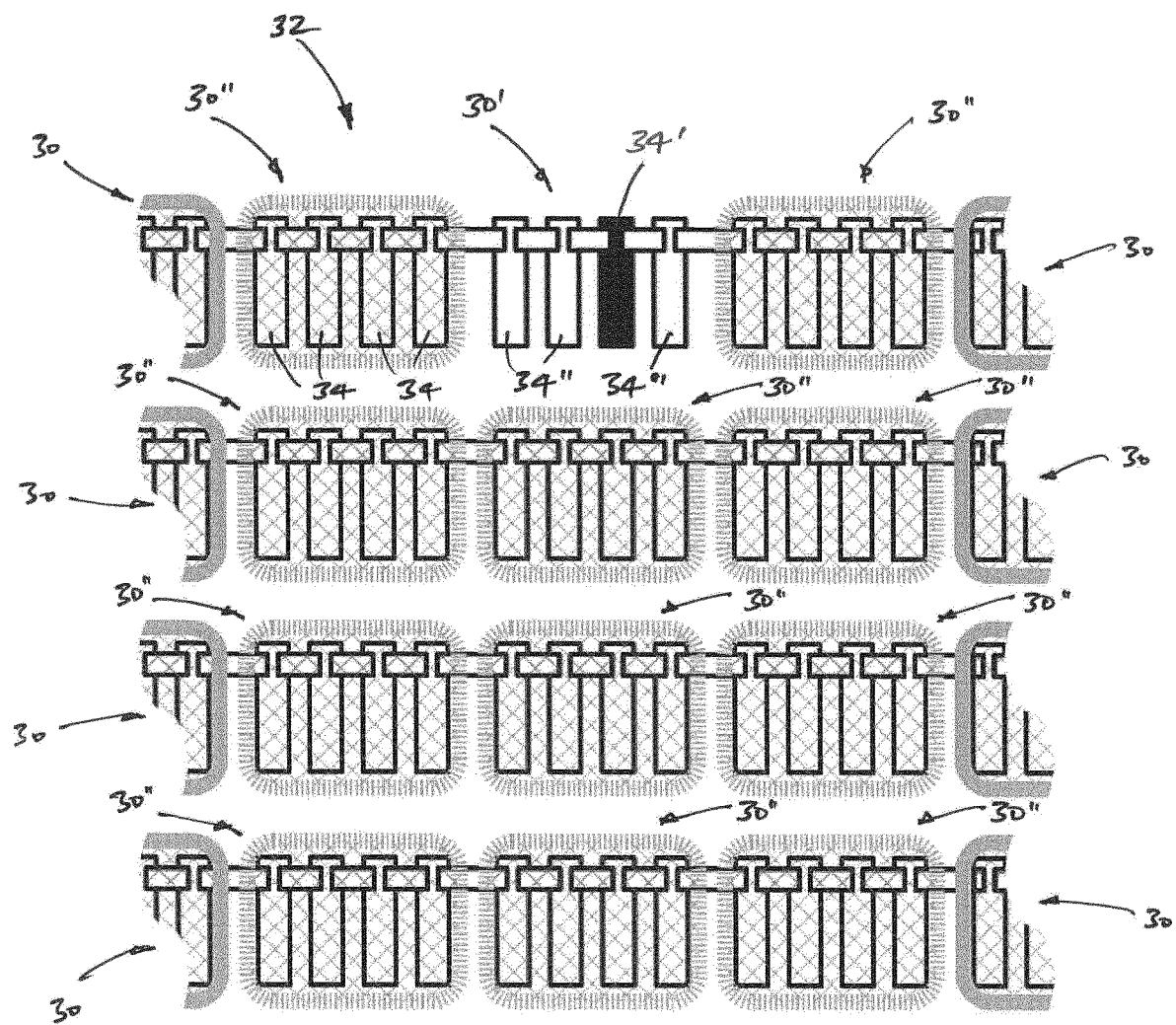
FIG. 3 illustrates the relative ease with which is it possible to access a single chain-link module within a high voltage assembly forming a part of the HVDC converter shown in FIG. 1.

The relative ease with which it is possible to access a single potentially defective chain-link module 34' within a given faulty high voltage assembly 30' (particularly one located on an uppermost tier of a valve 32), is shown schematically in FIG. 3.

Accordingly, when all of the high voltage assemblies 30 in a given HVDC voltage source converter 42 are protected by a corona shield 10, it is only necessary to verify the absence of a voltage, i.e. to confirm that no residual stored energy (in the form of stored charge) remains, in respect of only those chain-link modules 34 in the faulty high voltage assembly 30', i.e. only the potentially defective chain-link module 34' and the three other chain-link modules 34". This is in contrast to the need otherwise to verify the absence of a voltage, so to confirm that there is no risk of electric shock, in relation to all of the chain-link modules 34 in each of the adjacent high voltage assemblies 30" (as shown in broken line in FIG. 3) past which access is required by a maintenance operative to reach the potentially defective chain-link module 34'.

The invention claimed is:

1. A corona shield for a high voltage assembly with a charge storage capability, comprising: a peripheral frame formed from one or more frame members and within which lies a frame apertures and a barrier member fixedly secured to the peripheral frame; the barrier member extending across and occluding the frame aperture to inhibit bodily ingress through the frame aperture, wherein the barrier member deforms for up to half of a depth of the frame aperture; and the corona shield is pivotally connected to the corresponding high voltage assembly so that the corona shield is moveable between a closed position in which it overlies and provides protection to the high voltage assembly and an open position in which an access to the high voltage assembly is possible.

2. The corona shield according to claim 1, wherein the barrier cannot deform beyond the frame aperture.

3. A high voltage assembly, for a HVDC converter, having secured thereto a corona shield according to claim 1.

4. A HVDC converter comprising a plurality of high voltage assemblies according to claim 1.

* * * * *